(12) United States Patent
Sekiguchi et al.

(10) Patent No.: US 8,451,069 B2
(45) Date of Patent: May 28, 2013

(54) OSCILLATOR HAVING NEGATIVE RESISTANCE DEVICE FOR GENERATING ELECTROMAGNETIC WAVE

(75) Inventors: Ryota Sekiguchi, Kawasaki (JP); Takeaki Itsuji, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 13/384,222

(22) PCT Filed: Sep. 3, 2010

(86) PCT No.: PCT/JP2010/065574
§ 371 (c)(1),
(2), (4) Date: Jan. 13, 2012

(87) PCT Pub. No.: WO2011/027913
PCT Pub. Date: Mar. 10, 2011

(65) Prior Publication Data
US 2012/0112844 A1 May 10, 2012

(30) Foreign Application Priority Data
Sep. 7, 2009 (JP) .................................. 2009-205672

(51) Int. Cl.
*H03B 7/14* (2006.01)
(52) U.S. Cl.
USPC .............................. 331/115; 331/132; 331/96
(58) Field of Classification Search .................. 331/115, 331/132, 107 G, 107 T
See application file for complete search history.

(56) References Cited

U.S. PATENT DOCUMENTS

| | | | | |
|---|---|---|---|---|
| 3,065,432 A | * | 11/1962 | Duncan | 332/126 |
| 3,195,071 A | | 7/1965 | Steinhoff et al. | |
| 3,218,573 A | | 11/1965 | Van Kessel et al. | |
| 4,801,898 A | * | 1/1989 | Obayashi | 331/132 |
| 5,446,419 A | * | 8/1995 | Miya et al. | 331/99 |
| 5,578,970 A | * | 11/1996 | Nguyen et al. | 331/75 |
| 5,675,295 A | | 10/1997 | Brebels et al. | |

(Continued)

FOREIGN PATENT DOCUMENTS
EP 0742639 A2 11/1996

OTHER PUBLICATIONS

Reddy, M., et al., Monolithic Schottky-Collector Resonant Tunnel Diode Oscillator Arrays to 650 GHz, IEEE Electron Device Letters, vol. 18, No. 5, pp. 218-221, May 1997.

(Continued)

*Primary Examiner* — Joseph Chang
(74) *Attorney, Agent, or Firm* — Fitzpatrick, Cella, Harper & Scinto

(57) ABSTRACT

An oscillator having a negative resistance device and a resonator includes: a transmission line connected to the negative resistance device, a three-terminal device including a first terminal connected to the signal line side of the transmission line at a terminal part, a second terminal connected to the grounding line side of the transmission line and a third terminal receiving a control signal applied thereto; a first regulation unit for regulating the control signal to be applied to the third terminal; and a second regulation unit for regulating the voltage to be applied to the second terminal, the first and the second regulation unit being adapted to regulate respectively the control signal and the voltage so as to make the characteristic impedance of the transmission line and the impedance between the first and the second terminal show an impedance matching. The power consumption rate of the stabilizing circuit can be reduced.

6 Claims, 6 Drawing Sheets

U.S. PATENT DOCUMENTS

| | | | |
|---|---|---|---|
| 5,708,398 A * | 1/1998 | Shen et al. .................... 331/115 |
| 6,448,553 B1 | 9/2002 | Itsuji et al. |
| 6,835,925 B2 | 12/2004 | Itsuji et al. |
| 7,248,995 B2 | 7/2007 | Itsuji et al. |
| 7,358,918 B2 | 4/2008 | Itsuji |
| 7,386,024 B2 | 6/2008 | Sekiguchi et al. |
| 7,463,104 B2 | 12/2008 | Sekiguchi et al. |
| 7,542,000 B2 | 6/2009 | Itsuji |
| 7,560,695 B2 | 7/2009 | Kasai et al. |
| 7,570,216 B2 | 8/2009 | Itsuji |
| 7,633,299 B2 | 12/2009 | Itsuji |
| 7,684,455 B2 | 3/2010 | Ouchi et al. |
| 7,709,797 B2 | 5/2010 | Sekiguchi et al. |
| 7,745,791 B2 | 6/2010 | Kasai et al. |
| 7,869,036 B2 | 1/2011 | Kajiki et al. |
| 7,884,767 B2 | 2/2011 | Itsuji |
| 7,889,015 B2 | 2/2011 | Sekiguchi et al. |
| 7,919,752 B2 | 4/2011 | Itsuji |
| 7,922,659 B2 | 4/2011 | Itsuji et al. |
| 7,924,107 B2 | 4/2011 | Koyama et al. |
| 7,933,305 B2 | 4/2011 | Ouchi et al. |
| 8,003,961 B2 | 8/2011 | Itsuji |
| 8,067,739 B2 | 11/2011 | Itsuji |
| 8,129,683 B2 | 3/2012 | Itsuji et al. |
| 2010/0252738 A1 | 10/2010 | Kasai et al. |
| 2010/0288928 A1 | 11/2010 | Katagiri et al. |
| 2011/0089516 A1 | 4/2011 | Sekiguchi |
| 2011/0248724 A1 | 10/2011 | Sekiguchi |

OTHER PUBLICATIONS

Reddy, M., et al., Bias Stabilization for Resonant Tunnel Diode Oscillators, IEEE Microwave and Guided Wave Letters, vol. 5, No. 7, pp. 219-221, Jul. 1995.

International Preliminary Report on Patentability dated Mar. 13, 2012 issued in corresponding PCT Patent Application No. PCT/JP2010/065574.

U.S. Appl. No. 13/384,223, filed Jan. 13, 2012. Applicant: Toshihiko Ouchi, et al.

U.S. Appl. No. 13/384,758, filed Jan. 18, 2012. Applicant: Yasushi Koyama, et al.

U.S. Appl. No. 13/406,491, filed Feb. 27, 2012. Applicant: Takeaki Itsuji.

* cited by examiner

OSCILLATOR HAVING NEGATIVE RESISTANCE DEVICE FOR GENERATING ELECTROMAGNETIC WAVE

TECHNICAL FIELD

The present invention relates to an oscillator having a negative resistance device for generating an electromagnetic wave. More particularly, the present invention relates to an oscillator for oscillating an electromagnetic wave in a frequency band within the frequency region from the millimeter wave band to the terahertz wave band (not less than 30 GHz and not more than 30 THz).

BACKGROUND ART

Negative resistance devices are used in the field of application of electromagnetic wave oscillators in combination with a resonator. It is known that such an oscillator generates an electromagnetic wave including at least part of the frequency region from the millimeter wave band to the terahertz wave band (not less than 30 GHz and not more than 30 THz) (to be also referred simply as terahertz wave). Non Patent Literature 1 discloses an oscillator formed by monolithically employing a negative resistance device on a substrate. In the disclosed oscillator, a slot antenna is integrally formed on a semiconductor substrate that carries a negative resistance device and a resonator structure and a gain medium are monolithically arranged.

FIG. 8 illustrates the oscillator disclosed in Non Patent Literature 1. In the oscillator, a resonant tunneling diode (S-RTD 11) having a Schottky barrier is employed as negative resistance device at the collector side. A slot antenna is employed as resonator. The slot antenna of Non Patent Literature 1 is formed as a metal pattern 12 on the semiconductor substrate and capacitors 13, 14 are arranged at the ends of the slot. The oscillator of Non Patent Literature 1 also has a rectifier diode 15. The rectifier diode 15 operates as stabilizing circuit for suppressing parasitic oscillations. A parasitic oscillation specifically refers to a oscillation generated parasitically in a frequency band different from an intended frequency and located at the low frequency side. Such a parasitic oscillation can give rise to problems in oscillators employing a negative resistance device in that it remarkably lower the oscillation output at an intended frequency. So, provision of a stabilizing circuit is very important in an oscillator employing a negative resistance device. For details, refer to Non Patent Literature 2. According to the literature, the impedance of the power supply for supplying a bias in a frequency region not lower than DC and lower than $\omega_{osc}$ needs to be low in order to suppress parasitic oscillations, provided that the oscillation wavelength and the oscillation frequency of an oscillator are $\lambda_{osc}$ and $\omega_{osc}$ respectively. As a technique for achieving this purpose, a low impedance circuit (e.g., a shunt rectifier diode) should be arranged at a position within $\lambda_{osc}/4$ as viewed from the S-RTD toward the power supply side. For this reason, in FIG. 8, a rectifier diode 15 is integrally arranged at a position within $\lambda_{osc}/4$ as viewed from the S-RTD 11 toward the side of the power supply 16. In FIG. 8, 17 represents the sum of the internal resistance of the power supply 16 and the resistance of the connection line.

Citation List
Non Patent Literature

NPL 1: Journal of IEEE ELECTRON DEVICE LETTERS, Vol. 18, 218 (1997)

NPL 2: Journal of IEEE MICROWAVE AND GUIDED WAVE LETTERS, Vol. 5, 219 (1995)

SUMMARY OF THE INVENTION

Technical Problem

However, since the rectifier diode in the stabilizing circuit of the above-described known oscillator is arranged in parallel with the negative resistance device, a voltage that is equal to the operating point voltage of the negative resistance device is applied to the rectifier diode so that power is consumed from the power supply to a large extent. This is a problem that commonly arises when a shunt device is employed and not limited to the use of a rectifier diode. Therefore, a high power consumption rate of the stabilizing circuit in known oscillators is a large problem.

Solution to Problem

In an aspect of the present invention, an oscillator having a negative resistance device and a resonator includes:
a transmission line connected to the negative resistance device;
a three-terminal device including:
a first terminal connected to the signal line side of the transmission line at a terminal part of the transmission line;
a second terminal connected to the grounding line side of the transmission line; and
a third terminal for receiving a control signal to be applied thereto;
a first regulation unit for regulating the control signal to be applied to the third terminal of the three-terminal device; and
a second regulation unit for regulating voltage to be applied to the second terminal,
the first regulation unit and the second regulation unit being adapted to regulate respectively the control signal and the voltage so as to make the characteristic impedance of the transmission line and the impedance between the first terminal and the second terminal of the three-terminal device show an impedance matching.

Other feature and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Figure 1A:
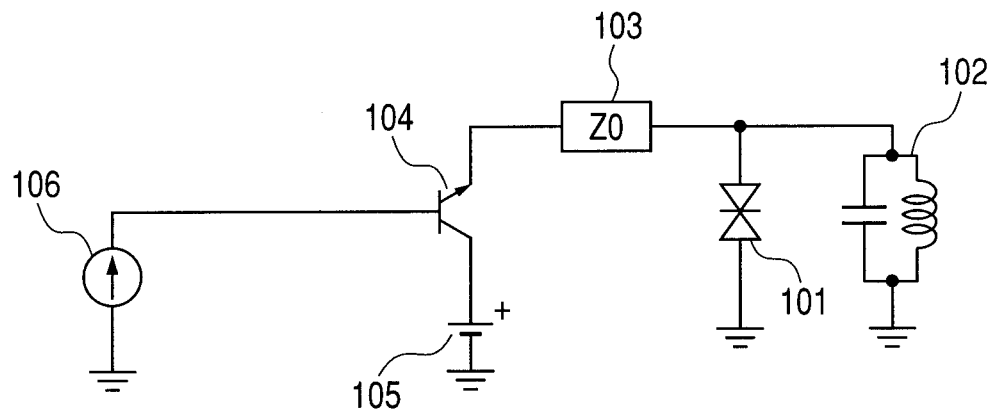
FIG. 1A is a schematic illustration of the configuration of the oscillation circuit of Embodiment 1.

Preferred embodiments of the present invention will now be described in detail in accordance with the accompanying drawings.

What is important for an oscillator according to the present invention is the following points. Namely, a three-terminal device having, a first terminal to be connected to the signal line side of a transmission line at a terminal part of the transmission line, a second terminal connected to the grounding line side of the transmission line, and a third terminal for receiving a control signal to be applied thereto, is connected in series with a negative resistance device by way of the transmission line. Then, the control signal to be applied to the third terminal of the three-terminal device are so regulated to control the voltage to be applied the second terminal, so as to make the characteristic impedance of the transmission line and the impedance between the first terminal and the second terminal of the three-terminal device show an impedance matching. The three-terminal device may typically be a transistor, a field effect transistor, although any three-terminal device may be employed so long as it has a similar feature that can realize the above points. On the basis of the above-described idea, an oscillator according to the present invention is made to have the above-described basic configuration.

In accordance with the above-described basic configuration, an oscillator according to the present invention may have any of the specific configurations as described below. For instance, the three-terminal device may be a transistor and the emitter of the transistor may be connected to the signal line side of the transmission line at a terminal part of the transmission line while a collector of the transistor may be connected to the grounding line side of the transmission line. Then, a first regulation unit regulates the base current and a second regulation unit regulates the collector voltage so as to make the characteristic impedance of the transmission line and the inter-emitter-collector impedance of the transistor show an impedance matching (see Embodiment 1 etc., which will be described hereinafter). Alternatively, the three-terminal device may be a field effect transistor and the source of the field effect transistor is connected to the signal line side of the transmission line at a terminal part of the transmission line while the drain of the field effect transistor is connected to the grounding line side of the transmission line. Then, the first regulation unit regulates the gate voltage and the second regulation unit regulates the drain voltage so as to make the characteristic impedance of the transmission line and the inter-source-drain impedance of the field effect transistor show an impedance matching (see Embodiment 4 etc., which will be described hereinafter).

Still alternatively, an oscillator according to the present invention may include a plurality of pairs of a transmission line and a three-terminal device in which any of the pairs are connected to a negative resistance device in parallel (see Embodiment 3 etc., which will be described hereinafter). Then, a resonator may be arranged as a distributed-element circuit while the negative resistance device may be arranged as a lumped-element device (see Example 1, which will be described hereinafter). Alternatively, a resonator may be arranged as a distributed-element circuit and the negative resistance device may be arranged as a distributed-element device integrated with a distributed-element circuit (see Example 2, which will be described hereinafter).

(Embodiment 1)

Figure 1B:
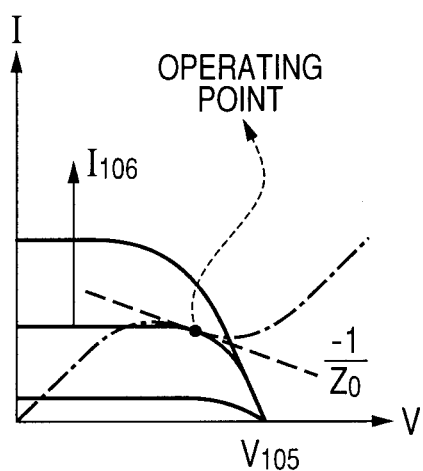
FIG. 1B is a schematic illustration of the operating point of the oscillation circuit of Embodiment 1 and the impedance at the operating point.

The oscillator, or the oscillation circuit, of Embodiment 1 will be described below by referring to FIGS. 1A and 1B. FIG. 1A is a schematic illustration of the oscillation circuit of this embodiment and FIG. 1B is a schematic illustration of the operating point of the oscillation circuit of this embodiment and the impedance at the operating point. In FIG. 1A, 101 is a negative resistance device for generating an electromagnetic wave and 102 is a resonator, or a resonance circuit, for determining the resonance frequency of the oscillation circuit. The resonance circuit 102 is desirably of the distribution constant type in the frequency band from the millimeter wave band to the terahertz wave band (not less than 30 GHz and not more than 30 THz).

103 is a transmission line having characteristic impedance $Z_0$. The transmission line 103 takes a role of supplying a bias to the negative resistance device 101 and is connected to the opposite poles of the negative resistance device. 104 is a transistor, which is a three-terminal device that forms a stabilizing circuit with the transmission line 103. The transistor 104 is also connected to the transmission line 103. In particular, the emitter is connected to the signal line side of the transmission line 103 connected to the negative resistance device 101 while the collector is connected to the grounding line side of the transmission line 103 by way of voltage source 105 as a second regulation unit. Thus, there is formed an emitter follower having current source 106 as a first regulation unit connected to the base, and the negative resistance device 101 respectively as input (control signal input) and output. Besides, the negative resistance device 101 and the transistor 104 are connected in series relative to the voltage source 105. Thus, the transistor 104 and the voltage source 105 at the collector side operate as bias supply source for the negative resistance device 101, which is a load.

Furthermore, the transmission line 103 of this embodiment also takes a role of transmitting an electromagnetic wave that does not resonate with the resonance circuit 102 down to the ground without any reflection. For this purpose, the voltage source 105 and the current source 106 are so regulated as to make the characteristic impedance $Z_0$ of the transmission line 103 and the inter-emitter-collector impedance of the transistor 104 show an impedance matching. Therefore, the oscillation circuit of this embodiment has a circuit configuration that does not have nay resonance point in any frequency region other than the oscillation frequency $\omega_{osc}$ that is determined by the resonance circuit 102. This corresponds to the fact that a known oscillation circuit having a low impedance circuit does not satisfy the oscillation requirement defined by (formula 1) shown below, whereas the oscillation circuit of this embodiment satisfies the oscillation requirement defined by (formula 2) shown below:

$$Re(Y)<0 \qquad \text{(formula 1) and}$$

$$Im(Y)=0 \qquad \text{(formula 2),}$$

where Y is the admittance of the entire oscillation circuit and the (formula 1) and the (formula 2) are known as oscillation requirements of an oscillation circuit having a negative resistance device. This operation principle is common to this embodiment.

From the above description, it will be seen that the transistor 104 of this embodiment is required to regulate the operating point at the negative resistance device 101 and the impedance matching with the transmission line 103 at the same time. For this purpose, the voltage source 105 and the current source 106 that are independent sources are regulated in a manner as described below. Namely, the operating point at the negative resistance device 101 can be regulated in the direction of the voltage V in FIG. 1B by varying the voltage $V_{105}$ of the voltage source 105. Similarly, the operating point at the negative resistance device 101 can be regulated in the direction of the electric current I in FIG. 1B by varying the electric current $I_{106}$ of the current source 106 and the differential conductance $dI_c/dV_{ce}$ between the emitter and the collector of the transistor 104 at the operating point can also be regulated by doing so. Since the reciprocal of $dI_c/dV_{ce}$ is the inter-emitter-collector impedance of the transistor 104, the operating point and the impedance at the operating point can be regulated at the same time by the above regulation. For impedance matching, $dI_c/dV_{cc}$ at the operating point and the inclination of $-1/Z_0$ indicated by the auxiliary line (coarse broken line) in FIG. 1B are made to agree with each other. For this purpose, the saturation region of the transistor 104 may well be utilized. Fortunately, the characteristic impedance of a typical line is from several Ω (ohms) to several hundreds of Ω (ohms) so that matching with the inter-emitter-collector impedance of a transistor showing a relatively low resistance can be realized with ease. Note that, in FIG. 1B, the single-dotted chain line shows the voltage/current characteristic in the negative resistance region of the negative resistance device 101 and the plurality of solid lines indicate the static characteristics of the transistor 104 at a plurality of base currents, while the fine broken line indicates the operating point.

Power is supplied to the oscillation circuit of this embodiment from the voltage source 105 and consumed between the emitter and the collector of the transistor 104 and the negative resistance device 101. Therefore, electric power that will be consumed by other than the oscillation circuit may include electric power that will be consumed between the emitter and the collector (=the inter-emitter-collector voltage $V_{ce}$×the collector current $I_c$). When operated in the saturation region, the inter-emitter-collector voltage $V_{ce}$ may well be regarded to be nearly same with the inter-emitter-base voltage $V_{be}$ where the base current $I_b$ is turned on. The inter-emitter-base voltage $V_{be}$ is relatively low and may typically be 0.7 V, although it varies depending on the semiconductor arrangement of the transistor 104. On the other hand, the operating point voltage of the negative resistance device 101 is relatively high, although the operating point voltage may vary to a large extent from several hundreds of mV (millivolts) to several V (volts) depending on the negative resistance device 101. With regard to this point, the power consumption rate of the stabilizing circuit of this embodiment formed by using the transmission line 103 and the emitter follower (the transistor 104) is lower than any comparable circuit having a known circuit configuration. It should be noted that the operating region of the transistor 104 is by no means limited to the saturation region and an active region may alternatively be utilized so long as the power consumption rate is lower than any comparable circuit having a known circuit configuration.

(Embodiment 2)

Figure 2:
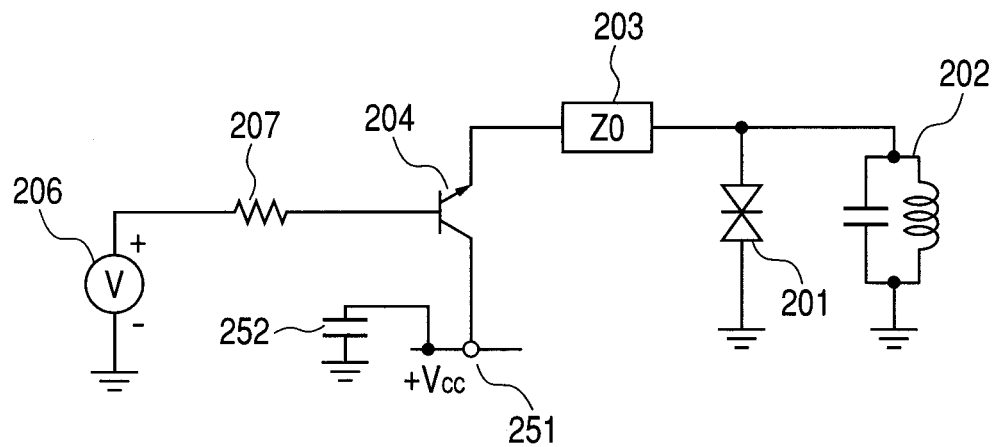
FIG. 2 is a schematic illustration of the configuration of the oscillation circuit of Embodiment 2.

The oscillator, or the oscillation circuit, of Embodiment 2 will be described below by referring to FIG. 2. In FIG. 2, negative resistance device 201, resonator or resonance circuit 202, line 203 showing characteristic impedance $Z_0$ and transistor 204 are same as those of Embodiment 1.

The circuit of the voltage source of this embodiment, which is a second regulation unit, is formed by a power supply line 251 having voltage $V_{cc}$ and a decoupling capacitor 252. Because of this circuit arrangement, the voltage source may not necessarily be an AC short-circuited ideal voltage source. In other words, it is sufficient for the decoupling capacitor 252 to operate in a frequency region where it is desirably short-circuited. A frequency region where it is desirably short-circuited is a frequency region where any parasitic oscillation is desirably suppressed. While the frequency region is preferably a frequency region of not less than DC and less than $\omega_{osc}$, a parasitic oscillation does not normally take place at or near DC. Therefore, in many cases, several MHz may be sufficient for the bottom side of the frequency region, which can be handled by utilizing the decoupling capacitor 252.

The circuit of the current source, which is a first regulation unit of this embodiment, is formed by a power supply 206 and a resistor 207. For this reason, the current source may not necessarily be an ideal current source having a sufficiently large internal resistance. Thus, the resistance of the resistor 207 may well be several kΩ.

In order to regulate the operating point of the oscillation circuit and the impedance at the operating point in the present embodiment, $V_{cc}$ of the power supply line 251 can be regulated by means of an external power supply and the electric current $I_b$ can be regulated by regulating the voltage of the power supply 206. Thus, this embodiment is a typical embodiment where the voltage source and the current source for regulating the transistor can be formed by using a simpler circuit configuration in the above-described manner.

(Embodiment 3)

Figure 3:
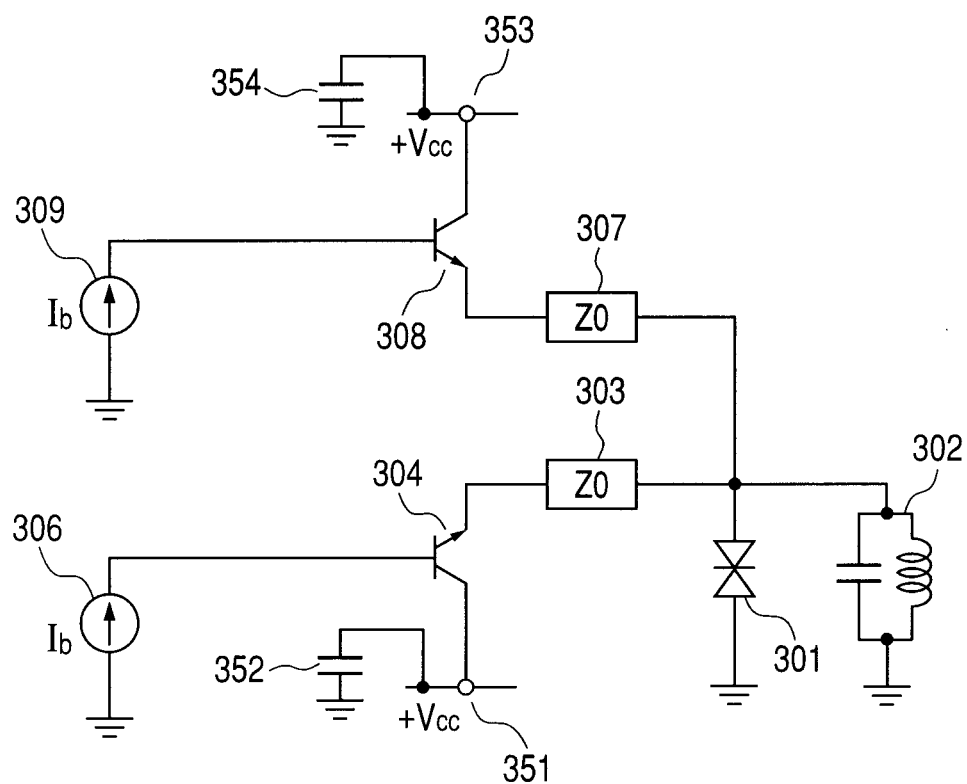
FIG. 3 is a schematic illustration of the configuration of the oscillation circuit of Embodiment 3.

The oscillator, or the oscillation circuit, of Embodiment 3 will be described below by referring to FIG. 3. In FIG. 3, negative resistance device 301, resonance circuit 302, line 303 showing characteristic impedance $Z_0$, transistor 304 and current source 306 are same as those of Embodiment 1. Additionally, power supply line 351 and decoupling capacitor 352 of this embodiment are same as those of Embodiment 2.

A pair of stabilizing circuits is provided in this embodiment. One of the stabilizing circuits is formed by using the transmission line 303 and the transistor 304 while the other stabilizing circuit is formed by using a transmission line 307 and a transistor 308. They are connected in parallel relative to the negative resistance device 301. As a result, another current source 309 is required. As for a power supply line 353 and a decoupling capacitor 354 in FIG. 3, the power supply line 351 and the decoupling capacitor 352 may be shared by the stabilizing circuits. Thus, this embodiment has two bias supply sources for the negative resistance device 301, and the electric current to be supplied can be doubled to $2I_c$. Additionally, since there are two lines for supplying bias, the problem of a burnt and cut line will seldom occur. It may be needless to say that the number of stabilizing circuits is by no means limited to two and n stabilizing circuits may alternatively be provided (n=2, 3, 4 . . . ).

This embodiment is effective when the negative resistance value of the negative resistance device 301 is particularly low. As pointed out earlier, the characteristic impedance $Z_0$ of the transmission line 303 is between several Ω (ohms) and several hundreds of Ω (ohms). The inter-emitter-collector impedance of the transistor 304 that shows impedance matching with the transmission line 303 is equal to the characteristic impedance $Z_0$. Therefore, when the absolute value of the negative resistance of the negative resistance device 301 is particularly low, the absolute value can fall short of the inter-emitter-collector impedance of the transistor 304. If such is the case, there can arise a problem that the operating point cannot be selected in the negative resistance region of the negative resistance device 301. However, the synthetic impedance of the above impedance and the inter-emitter-collector impedance of the other transistor 308 will be a half of each of the impedances. When n stabilizing circuits are provided, the synthetic impedance will be 1/n (n=2, 3, 4, . . . ) of each of the impedances. Thus, when a plurality of stabilizing circuits are provided, a situation where the absolute value of the negative resistance falls short of the synthetic impedance can be avoided so that the operating point of the negative resistance device 301 can be arbitrarily selected.

As described above, this embodiment is one that provides an advantage that the operating point of the negative resistance device can be arbitrarily selected when the negative resistance of the negative resistance device is particularly low.

(Embodiment 4)

Figure 4A:
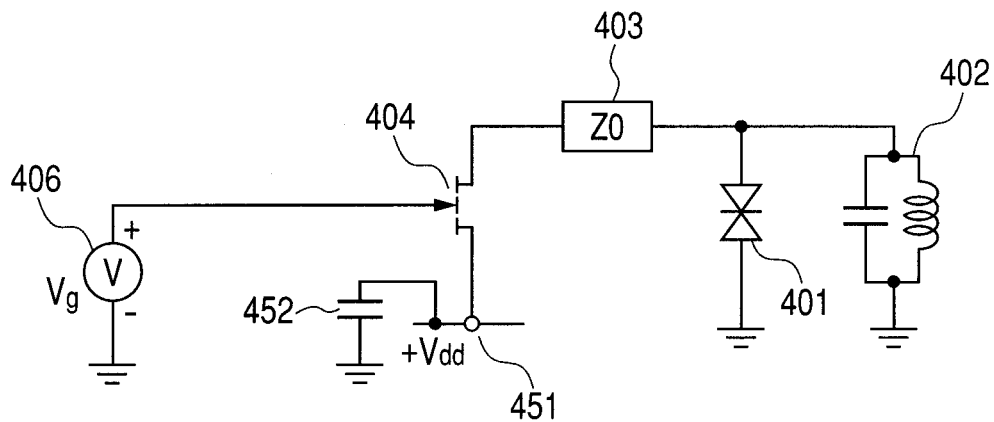
FIG. 4A is a schematic illustration of the configuration of the oscillation circuit of Embodiment 4.
Figure 4B:
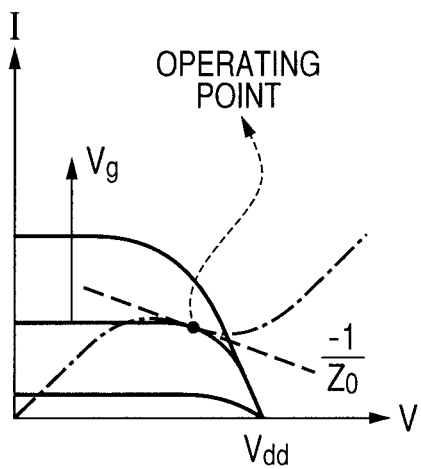
FIG. 4B is a schematic illustration of the operating point of the oscillation circuit of Embodiment 4 and the impedance at the operating point.

The oscillator, or the oscillation circuit, of Embodiment 4 will be described below by referring to FIGS. 4A and 4B. FIG. 4A is a schematic illustration of the oscillation circuit of this embodiment. In FIG. 4A, negative resistance device 401, resonance circuit 402 and line 403 showing characteristic impedance $Z_0$ are same as those of Embodiment 1. Additionally, a power supply line 451 and a decoupling capacitor 452 of this embodiment are same as those of Embodiment 2.

The transistor of any of the preceding embodiments is replaced by a field effect transistor 404 in this embodiment. Of the field effect transistor, the source is connected to the signal line side of the transmission line 403 that is connected to the negative resistance device 401 and the drain is connected to the grounding line side by way of the power supply line 451 showing voltage $V_{dd}$ and the decoupling capacitor 452. Thus, a source follower having a power supply 406 connected to the gate and the negative resistance device 401 respectively as input and output is formed. Besides, as in the case of Embodiment 1, the negative resistance device 401 and the field effect transistor 404 are connected in series relative to the power supply 451. Thus, the field effect transistor 404 and the power supply 451 operate as bias supply source for the negative resistance device 401, which is a load.

The field effect transistor 404 of this embodiment is required to regulate the operating point at the negative resistance device 401 and the impedance matching with the transmission line 403 at the same time. For this purpose, the two power supplies 451, 406 that are independent from each other are regulated in a manner as described below. Namely, the operating point at the negative resistance device 401 can be regulated in the direction of the voltage V in FIG. 4B by varying the voltage $V_{cd}$ of the power supply line 451 while the operating point at the negative resistance device 401 can be regulated in the direction of the current I in FIG. 4B by varying the voltage $V_g$ of the power supply 406 and, at the same time, the differential conductance $dI_d/dV_{ds}$ between the source and the drain of the field effect transistor 404 at the operating point can also be regulated by doing so. Since the reciprocal of $dI_d/dV_{ds}$ is the inter-source-drain impedance of the field effect transistor 404, the operating point and the impedance at the operating point can be regulated at the same time by the above regulation. For impedance matching, $dI_d/dV_{ds}$ at the operating point and the inclination of $-1/Z_0$ indicated by the auxiliary line in FIG. 4B are made to agree with each other. For this purpose, the linear region of the field effect transistor 404 may well be utilized.

Electric power that will be consumed by other than the oscillation circuit of this embodiment may include electric power that will be consumed between the source and the drain (=the inter-source-drain voltage $V_{ds}$×the drain current $I_d$). When operated in the linear region, the inter-source-drain voltage $V_{ds}$ may well be regarded to be not greater than threshold voltage $V_t$. The threshold voltage $V_t$ is relatively low and may typically be −0.5 V, which varies depending on the semiconductor arrangement of the field effect transistor 404. To be more accurate, the inter-source-drain voltage $V_{cs}$ may well be regarded to be substantially equal to the pinch-off voltage $V_{ds}$−$V_t$ and can be made lower than the level of the threshold voltage $V_t$. Thus, this embodiment is one that can further reduce the power consumption rate of the transistor.

Meanwhile, a resonant tunneling diode (RTD), an Esaki diode or a Gunn diode, for instance, may be employed as negative resistance device in any of the above-described embodiments. A pnp-type transistor may be employed instead of an npn-type transistor. However, if a pnp-type transistor is employed, the polarities of the circuit elements in FIGS. 1A and 1B, 2 or 3, whichever appropriate, need to be inverted. A p-channel field effect transistor may be employed in place of an n-channel field effect transistor. An HFET (including a HEMT), a MOSFET, a JFET or an IGBT may also be employed.

Specific circuit configurations will be described further by referring to Examples listed below.

EXAMPLE 1

Figure 5A:
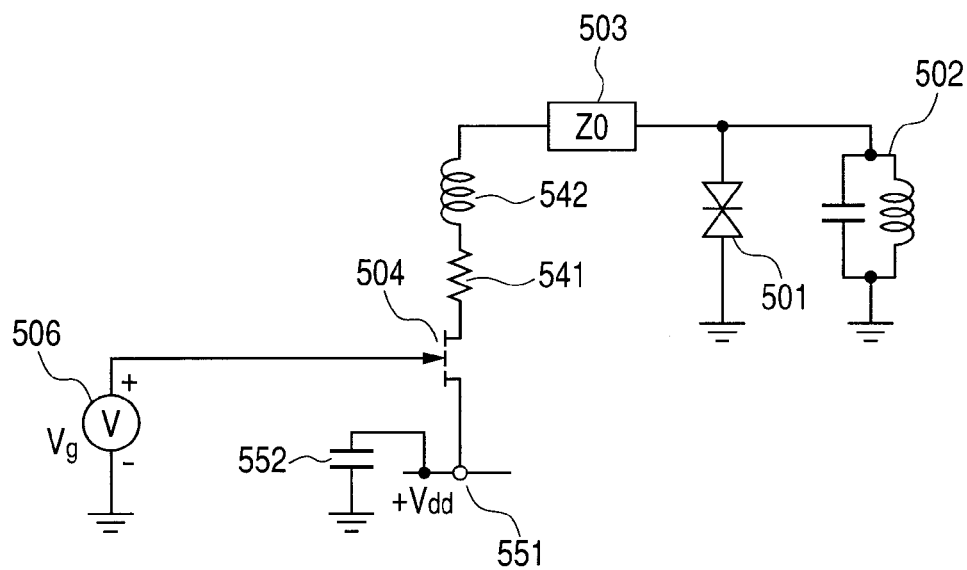
FIG. 5A is a schematic illustration of the configuration of the oscillation circuit of Example 1.
Figure 5B:
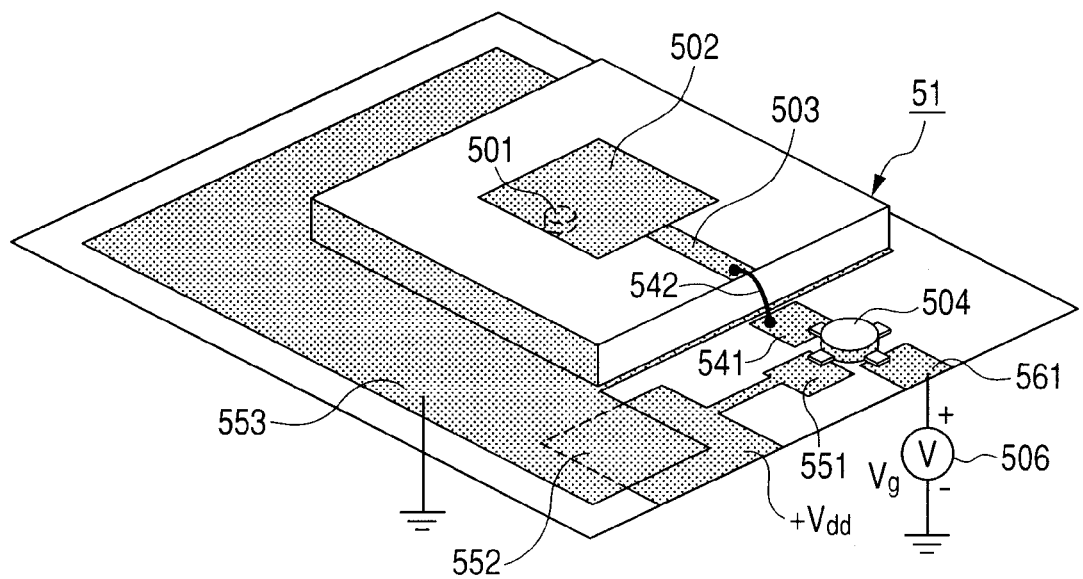
FIG. 5B is a schematic illustration of the configuration of the oscillator of Example 1.

The oscillator, or the oscillation circuit, of Example 1 will be described below by referring to FIGS. 5A and 5B. FIG. 5A is a schematic illustration of the oscillation circuit of Example 1. FIG. 5B is a schematic illustration of the structure of the oscillator realized by applying the oscillation circuit of Example 1.

In FIGS. 5A and 5B, 501 is a resonant tunneling diode RTD. The RTD 501 of this example is formed with a multiple quantum well structure of InGaAs/InAlAs, InGaAs/AlAs and an electric contact layer of n-InGaAs on an InP substrate 51. A triple barrier structure, for instance, may be used for the multiple quantum well structure. More specifically, the multiple quantum well structure may be formed by a semiconductor multi-layer film structure of AlAs(1.3 nm)/InGaAs (7.6 nm)/InAlAs (2.6 nm)/InGaAs (5.6 nm)/AlAs (1.3 nm). Of the layers, InGaAs is a well layer, and InAlAs that is lattice-matched and AlAs that is non-lattice-matched are barrier layers. These layers are intentionally undoped. In other words, they are not subjected to carrier-doping. The multiple quantum well structure is sandwiched between electric contact layers of n-InGaAs showing an electronic density of $2\times10^{18} cm^{-3}$. With the current/voltage (I-V) characteristic of such a structure sandwiched between electric contact layers, the peak current density is 280 kA/cm$^2$ and the negative resistance region is between about 0.7 V and about 0.9 V. When the resonant tunneling diode shows a mesa structure of about 2 μmΦ, a peak current of 9 mA and a negative resistance of −22 Ω are obtained.

In FIGS. 5A and 5B, 502 is a resonant circuit formed by utilizing a patch antenna. A square pattern conductor patch of 200 μm×200 μm with a designed oscillation frequency of 410 GHz is employed in this example. The patch antenna 502 also operates as one of the electrodes of the RTD 501, whereas a grounding conductor (not illustrated) operates as the other electrode of the RTD 501. 503 is a micro-strip line designed to show a characteristic impedance of $Z_0$=20 Ω. The micro-strip line 503 is connected to the negative resistance device 501 by way of the patch antenna 502. In this example, a conductor is commonly employed as the grounding conductor (not illustrated) of the patch antenna and also as the grounding conductor (not illustrated) of the micro-strip line. The micro-strip line 503 is extended to the vicinity of an end of die (InP substrate) 51.

In FIGS. 5A and 5B, 504 is an HFET. An NE3514S02 (available from NEC Electronics) is employed in this example. The HFET 504 is integrally arranged on a source electrode 541, a drain electrode 551 and a gate electrode 561 that are arranged on a receptor where the die 51 is bonded. The HFET 504 is connected to the micro-strip line 503 by way of a wire bonding 542. The series resistance including the contact resistance at the source electrode 541 and the inductance at the wire bonding 542 can be regarded to be similar to those of Embodiment 4 if they are considered to be included in lumped-element device 504. A conductor is commonly employed for both the drain electrode 551 and the power supply line of voltage $V_{dd}$. A decoupling capacitor is formed by arranging a MIM (metal-insulator-metal) 552 between the power supply line 551 and grounding conductor 553. It may be needless to say that a decoupling capacitor having a greater capacitance and adapted to accommodate a low frequency region may be arranged externally. The gate electrode 561 is connected to a power supply 506.

The operating point of the oscillation circuit and the impedance at the operating point of this example can be regulated in a manner as described below. Firstly, make sure by referring to the data sheet of NE3514S02 that there is a region where $dI_d/dV_{ds}$ can agree with $1/Z_0=0.05S$ when $V_{ds}$ is between 0 V and 0.4 V and $V_{gs}$ is between 0 V and −0.4 V. To be more accurate, compute $dI_d/dV_{ds}$ so as to include the series resistance 541 and the inductance 542. Then, assume that $V_{dd}=V_{ds}+0.8$ V and $V_g=V_{gs}+0.8$ V, considering that the operating point of the RTD 501 is at or in the vicinity of 0.8V. Thus, it is sufficient to regulate the voltage $V_{dd}$ of the power supply line 551 and the voltage of the power supply 506 respectively between 0.8 V and 1.3 V and between 0.8 V and 0.4 V. For example, if it is desirable to select 0.8 V and 7 mA for the operating point of the RTD 501, assuming that the series resistance 541 and the inductance 542 are sufficiently small, $V_{dc}=0.9$ V and $V_g=0.6$ V will be selected.

Electric power that will be consumed by other than the oscillation circuit of this example includes electric power that will be consumed between the source and the drain. If it is assumed that the operating point of the RTD 501 is 0.8 V and 7 mA while the voltage of the power supply line 551 is $V_{dd}=0.9$ V and the voltage of the power supply 506 is $V_g=0.6$ V, $V_{ds}=0.1$ V and $I_d=7$ mA. In other words, the power consumption rate will be 0.1 V×7 mA=0.7 mW. Let's compare this with the power consumption rate of a known shunt device. According to Non Patent Literature 2, the resistance of the shunt device needs to be not higher than 22 Ω. In other words, if the shunt device is taken for a simple resistor for calculations, the power consumption rate is estimated to be 0.8 $V^2$/22 Ω=29 mW. Thus, a stabilizing circuit formed by using a transmission line 503 and a source follower (transistor 504) of this example consumes less power if compared with the known circuit configuration.

EXAMPLE 2

Figure 6A:
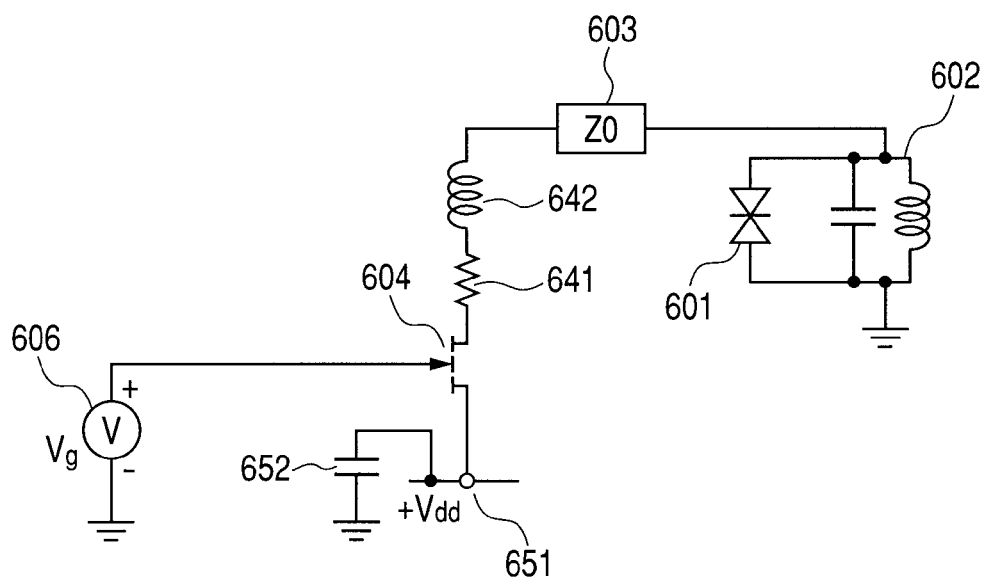
FIG. 6A is a schematic illustration of the configuration of the oscillation circuit of Example 2.
Figure 6B:
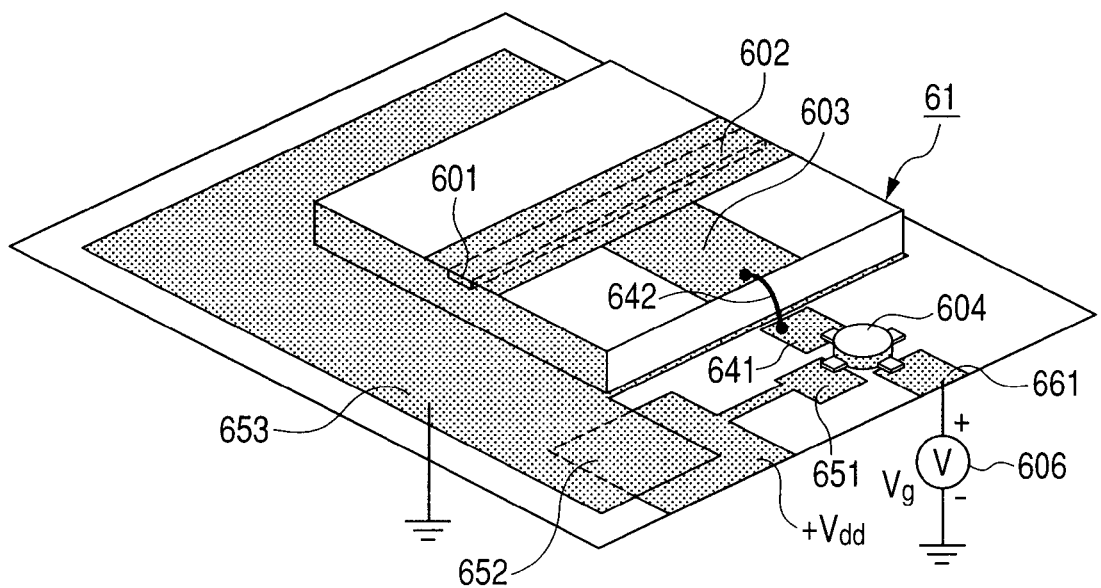
FIG. 6B is a schematic illustration of the configuration of the oscillator of Example 2.

The oscillator, or the oscillation circuit, of Example 2 will be described below by referring to FIGS. 6A and 6B. FIG. 6A is a schematic illustration of the oscillation circuit of Example 2. FIG. 6B is a schematic illustration of the structure of the oscillator realized by applying the oscillation circuit of Example 2.

This example provides a variation of the oscillator of Example 1. The arrangement of this example is substantially same as that of Example 1 except the profile of the negative resistance device 601 and that of the resonance circuit 602. The negative resistance device 601 shows a stripe-shaped mesa structure running along the resonance circuit 602. A peak current of about 2 A is obtained when the dimensions are 5 μm×150 μm. The resonance circuit 602 is formed by a surface plasmon waveguide utilizing a conductor strip and the length thereof in the direction of the resonator is 150 μm. Thus, the negative resistance device 601 is distributed integrally with the resonance circuit 602 along the direction of the resonator of the surface plasmon waveguide in this example. Strip 602 also operates as one of the electrodes of the negative resistance device 601 and the grounding conductor (not illustrated) also operates as the other electrode of the negative resistance device.

In FIGS. 6A and 6B, 603 is a broad micro-strip line. The micro-strip line has a width of 100 μm and a designed characteristic impedance of $Z_0=1$ Ω. Such a micro-strip line is employed in this example because a large electric current flows through the negative resistance device 601, although a plurality of micro-strip lines as described above for Embodiment 3 may alternatively be employed. In this example again, a conductor is commonly employed for the grounding conductor (not illustrated) of the resonance circuit and the grounding conductor (not illustrated) of the micro-strip line. The micro-strip line 603 is extended to the vicinity of an end of the die 61.

In FIGS. 6A and 6B, 604 is a power type field effect transistor. An NE5520379A (available from NEC Electronics) is employed in this example. This arrangement is selected for this example because a large electric current flows through the negative resistance device 601, although a plurality of transistors may alternatively be employed in a manner as described above for Embodiment 3. The operating point of the oscillation circuit and the impedance at the operating point of this example can be regulated in a manner as described below. Firstly, make sure by referring to the data sheet of NE5520379A that there is a region where $dI_d/dV_{ds}$ can agree with $1/Z_0=1$ S when $V_{ds}$ is between 0 V and 1 V and $V_{gs}$ is between 3.6 V and 2.4 V. To be more accurate, compute $dI_d/dV_{ds}$ so as to include the series resistance 641 and the inductance 642. Thus, it is sufficient to regulate the voltage $V_{dd}$ of the power supply line 651 and the voltage of the power supply 606 connected to gate electrode 661 respectively between 0.8 V and 1.8 V and between 4.2 V and 3.2 V, considering that the operating point of the negative resistance device 601 is at or in the vicinity of 0.8 V.

Note that a decoupling capacitor is formed in this example by arranging a MIM (metal-insulator-metal) 652 between the power supply line 651 and grounding conductor 653 as in the case of Example 1. It may be needless to say that a decoupling capacitor having a greater capacitance and adapted to accommodate a low frequency region may be arranged externally.

Electric power that will be consumed by other than the oscillation circuit of this example is similar to that of Example 1 and hence relatively small. The stabilizing circuit formed by employing the transmission line 603 and the source follower (transistor 604) consumes electric power only to a small extent and hence superior to the prior art in this respect.

The oscillator structure of each of the above-described examples may be implemented by using a through hole and a bump instead of using a wire bonding. In such an instance, it is sufficient to take the transistor that is a lumped-element device into consideration for the series resistance component and the reactance component.

Figure 7:
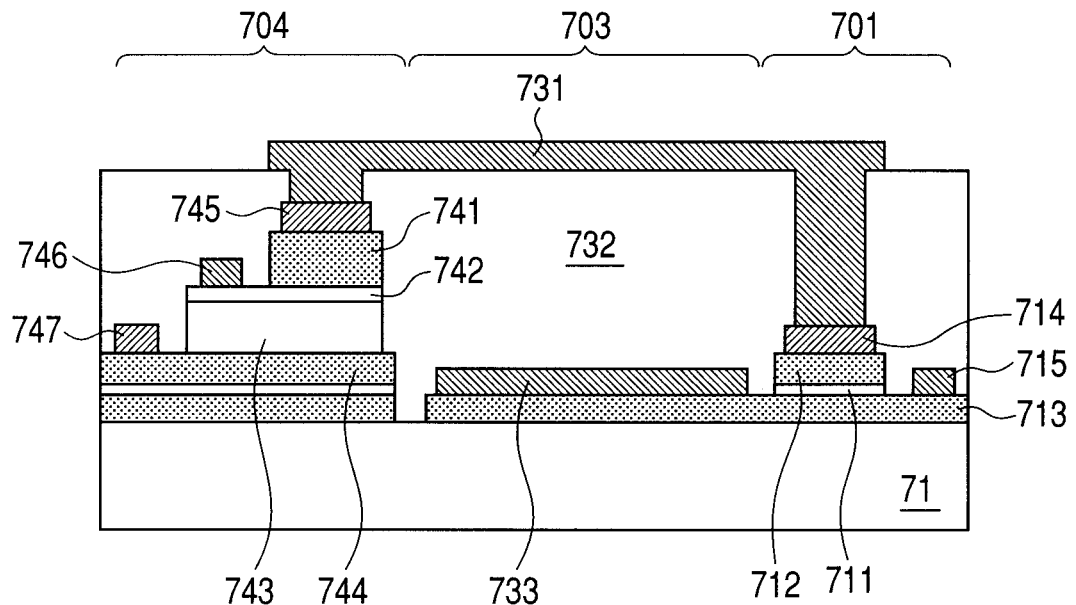
FIG. 7 is a schematic cross sectional view of an arrangement of integrally forming an oscillator according to the present invention on a single substrate.
Figure 8:
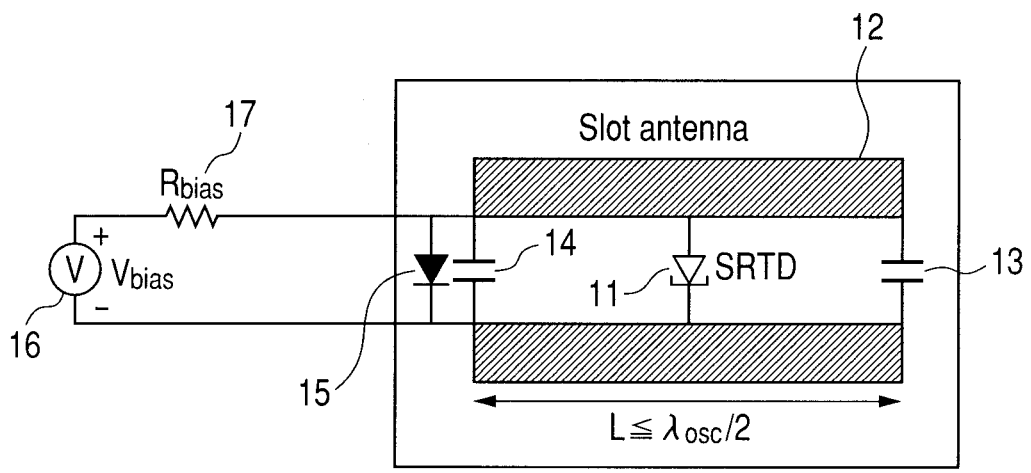
FIG. 8 is a schematic illustration of a prior art oscillator described in Non Patent Literature 1.

An oscillator structure formed by integrating a negative resistance device, a transmission line having characteristic impedance $Z_0$ and a transistor on a same substrate can also be formed instead of the above-described implementation. FIG. 7 is a schematic cross sectional view of an oscillator structure illustrated as an example. Negative resistance device 701 is formed by an active layer 711, electric contact layers 712, 713 and electrodes 714, 715 respectively held in contact with them. Line 703 is formed by a conductor strip 731, a dielectric 732 and a grounding electrode 733. Transistor 704 arranged on substrate 71 commonly with the negative resistance device 701 includes an emitter layer 741, a base layer 742, a collector layer 743 and a sub-collector layer 744 as well as an emitter electrode 745, a base electrode 746, a collector electrode 747 respectively held in contact with them. Strip 731 of the transmission line 703 is held in contact with the negative resistance device 701 and also with the emitter of the transistor 704. An oscillation circuit of this example can be realized by inserting a voltage source, arranging a MIM between the collector electrode 747 and the grounding electrode 733 because the grounding electrode 733 shows an electric potential equal to the electrode 715 of the negative resistance device 701.

As many apparently widely different embodiments of the present invention can be made without departing from the spirit and scope thereof, it is to be understood that the invention is not limited to the specific embodiments thereof except as defined in the claims.

Industrial Applicability

The present invention relates to an oscillator having a negative resistance device for generating an electromagnetic wave (a terahertz wave in particular). An oscillator according to the present invention can be used as the light source section of a tomography apparatus, a spectroscopic examination apparatus or radio communication equipment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-205672 filed on Sep. 7, 2009, which is hereby incorporated by reference herein in its entirety.

The invention claimed is:

1. An oscillator having a negative resistance device and a resonator and comprising:
a transmission line connected to the negative resistance device;
a three-terminal device including:
a first terminal connected to the signal line side of the transmission line at a terminal part of the transmission line;
a second terminal connected to the grounding line side of the transmission line; and
a third terminal for receiving a control signal to be applied thereto;
a first regulation unit for regulating the control signal to be applied to the third terminal of the three-terminal device; and
a second regulation unit for regulating voltage to be applied to the second terminal,
the first regulation unit and the second regulation unit being adapted to regulate respectively the control signal and the voltage so as to make the characteristic impedance of the transmission line and the impedance between the first terminal and the second terminal of the three-terminal device show an impedance matching.

2. The oscillator according to claim 1, characterized in that the three-terminal device is a transistor,
the emitter of the transistor is connected to the signal line side of the transmission line at a terminal part of the transmission line,
the collector of the transistor is connected to the grounding line side of the transmission line, and
the first regulation unit and the second regulation unit respectively regulate the base current and the collector voltage of the transistor so as to make the characteristic impedance of the transmission line and the inter-emitter-collector impedance of the transistor show an impedance matching.

3. The oscillator according to claim 1, characterized in that the three-terminal device is a field effect transistor, the source of the field effect transistor is connected to the signal line side of the transmission line at a terminal part of the transmission line,
the drain of the field effect transistor is connected to the grounding line side of the transmission line, and
the first regulation unit and the second regulation unit respectively regulate the gate voltage and the drain voltage of the field effect transistor so as to make the characteristic impedance of the transmission line and the inter-source-drain impedance of the field effect transistor show an impedance matching.

4. The oscillator according to claim 1, characterized in that the oscillator comprises a plurality of pairs of a transmission line and a three-terminal device, which are connected to the negative resistance device in parallel.

5. The oscillator according to claim 1, characterized in that the resonator is arranged as a distributed-element circuit while the negative resistance device is arranged as a lumped-element device.

6. The oscillator according to claim 1, characterized in that the resonator is arranged as a distributed-element circuit and the negative resistance device is arranged as a distributed-element device.

* * * * *